(12) United States Patent
Egashira

(10) Patent No.: US 9,452,452 B2
(45) Date of Patent: Sep. 27, 2016

(54) LIQUID PROCESSING APPARATUS

(71) Applicant: Tokyo Electron Limited, Tokyo (JP)

(72) Inventor: Koji Egashira, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 668 days.

(21) Appl. No.: 13/783,552

(22) Filed: Mar. 4, 2013

(65) Prior Publication Data

US 2013/0233360 A1    Sep. 12, 2013

(30) Foreign Application Priority Data

Mar. 9, 2012  (JP) ................................. 2012-053483

(51) Int. Cl.
*B08B 3/02* (2006.01)
*H01L 21/67* (2006.01)

(52) U.S. Cl.
CPC ........... *B08B 3/024* (2013.01); *H01L 21/6715* (2013.01); *H01L 21/67051* (2013.01)

(58) Field of Classification Search
CPC ............. B08B 3/024; H01L 21/67051; H01L 21/6715
USPC ........................................ 134/153, 198, 902
See application file for complete search history.

(56) References Cited

U.S. PATENT DOCUMENTS

2011/0308554 A1* 12/2011 Namba ............... H01L 21/6708
134/26

FOREIGN PATENT DOCUMENTS

| JP | 06-232109 A | 8/1994 |
| JP | 2003-174006 A | 6/2003 |
| JP | 2011-029593 A | 2/2011 |
| JP | 2011-222685 A | 11/2011 |

* cited by examiner

*Primary Examiner* — Michael Barr
*Assistant Examiner* — Levon J Shahinian
(74) *Attorney, Agent, or Firm* — Abelman, Frayne & Schwab

(57) ABSTRACT

A liquid processing apparatus according to the present disclosure includes a substrate holding unit configured to be rotated and hold a substrate from a bottom side thereof with substrate being spaced apart horizontally, a rotation driving unit configured to rotate the substrate holding unit, and an air supply unit provided above the substrate and configured to supply air toward the substrate held by the substrate holding unit. The liquid processing apparatus also includes an air supply path including a suction port that inhales the air supplied from the air supply unit and supplies the air inhaled from the suction port to a space formed between the substrate holding unit and a bottom surface of the substrate held by the substrate holding unit.

18 Claims, 7 Drawing Sheets

LIQUID PROCESSING APPARATUS

CROSS-REFERENCE TO RELATED APPLICATIONS

This application is based on and claims priority from Japanese Patent Application No. 2012-053483, filed on Mar. 9, 2012, with the Japanese Patent Office, the disclosure of which is incorporated herein in its entirety by reference.

TECHNICAL FIELD

The present disclosure relates to a liquid processing apparatus that performs a liquid processing for a substrate while holding the substrate horizontally.

BACKGROUND

In manufacturing processes of semiconductor products or flat panel displays (FPDs), a process is frequently used in which a processing liquid is supplied to a semiconductor wafer or a glass substrate ("a substrate to be processed") for performing a liquid processing. For example, such a process involves a cleaning processing that removes, for example, particles and contaminations attached to the substrate.

As for a liquid processing apparatus that performs a cleaning processing, a single wafer spin cleaning apparatus is known that supplies a processing liquid (for example, a chemical liquid and a rinse liquid) to a surface of a substrate such as, for example, a semiconductor wafer in a state where the substrate is held on a spin chuck and rotated horizontally, thereby performing a cleaning processing (See, e.g., Japanese Patent Application Laid-Open No. 6-232109).

SUMMARY

The present disclosure provides a liquid processing apparatus including: a substrate holding unit configured to be rotated and hold a substrate from a bottom side thereof with the substrate being spaced apart horizontally; a rotation driving unit configured to rotate the substrate holding unit; a nozzle configured to supply a processing liquid to the substrate held by the substrate holding unit; an air supply unit provided above the substrate held by the substrate holding unit and configured to supply air toward the substrate; and an air supply path having a suction port that inhales air supplied from the air supply unit and configured to supply the air inhaled from the suction port to a space formed between the substrate holding unit and a bottom surface of the substrate held by the substrate holding unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
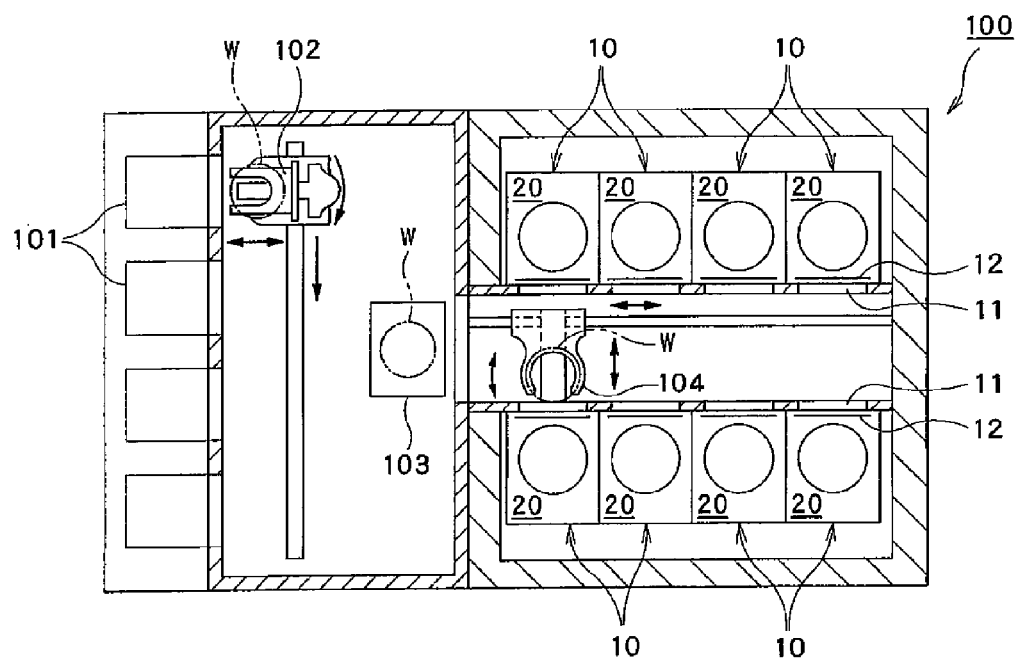
FIG. 1 is a plan view illustrating a liquid processing system including a liquid processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

When a wafer is rotated on a spin chuck, air is discharged by the rotation of the wafer from the space formed between the bottom surface of the wafer and the spin chuck around the diameter direction of the wafer. As a result, the pressure in the space decreases causing a problem that the wafer is flexed or damaged.

The processing apparatus disclosed in Japanese Patent Application Laid-Open No. 6-232109 supplies $N_2$ gas to the space between a bottom surface of the wafer and a spin chuck. In this case, there is a problem that the operation cost may increase by using $N_2$ gas. Specifically, when the size of the wafer is large, the amount of $N_2$ gas supplied to the space formed at the bottom side of the wafer increases, and as a result, the operation cost further increases.

The present disclosure has been made in an effort to provide a liquid processing apparatus capable of preventing the substrate from being flexed or damaged with a low operation cost.

The present disclosure provides a liquid processing apparatus including: a substrate holding unit configured to be rotated and hold a substrate from a bottom side thereof with the substrate being spaced apart horizontally; a rotation driving unit configured to rotate the substrate holding unit; a nozzle configured to supply a processing liquid to the substrate held by the substrate holding unit; an air supply unit provided above the substrate held by the substrate holding unit and configured to supply air toward the substrate; and an air supply path having a suction port that inhales air supplied from the air supply unit and configured to supply the air inhaled from the suction port to a space formed between the substrate holding unit and a bottom surface of the substrate held by the substrate holding unit.

The above described liquid processing apparatus may further include a recovery cup provided to surround the circumference of the substrate holding unit and configured to recover the processing liquid scattered from the substrate to the circumference. The suction port of the air supply path may be disposed in the outside of the recovery cup when viewed from the top.

The above described liquid processing apparatus may further include: a filter member configured to clean the air supplied from the air supply unit; and a baffle member provided to be spaced apart from the filter member and configured to distribute the air cleaned by the filter member evenly toward the substrate held by the substrate holding unit. The suction port of the air supply path may be disposed in a space formed between the filter member and the baffle member.

In the above described liquid processing apparatus, the air supply path may further include a supply port that supplies the air inhaled from the suction port to the space formed at the bottom side of the substrate, and the cross-section of the flow path of the suction port of the air supply path may be the same as or larger than that of the supply port.

In the above described liquid processing apparatus, the rotation driving unit may further include a cylindrical rotating shaft, and the air supply path may include a supply pipe that passes through the inner side of the rotating shaft.

In the above described liquid processing apparatus, a bottom side processing liquid supply pipe that supplies a processing liquid to the bottom surface of the substrate held by the substrate holding unit may be provided inside supply pipe.

In the above described liquid processing apparatus, the supply pipe of the air supply path may be connected to the rotating shaft of the rotation driving unit, and a generating mechanism may be provided on the inner surface of the supply pipe, the generating mechanism generating a swirl in the air passing through the supply pipe to increase the flow rate of the air supplied to the space formed at the bottom side of the substrate.

The above described liquid processing apparatus may further include a control unit configured to control the air supply unit. The control unit may control the air supply unit in such a manner that the flow rate of the air supplied from the air supply unit is increased as the number of revolutions of the substrate held by the substrate holding unit is increased.

According to the liquid processing apparatus of the present disclosure, the flexure or damage of the substrate may be suppressed with the low operation cost.

Hereinafter, the exemplary embodiments of the present disclosure will be described. In addition, in the figures accompanying the present specification, for the convenient and easy illustration and understanding, for example, the scale and the aspect ratio in size are properly changed and exaggerated from the real sizes.

First, referring to FIG. 1, a liquid processing system according to an exemplary embodiment of the present disclosure will be described.

As illustrated in FIG. 1, a liquid processing system 100 includes: a disposing table 101 on which a carrier accommodating a substrate to be processed such as, for example, a semiconductor wafer W ("wafer W") is disposed from the outside; a transport arm 102 configured to take out wafer W accommodated in the carrier; a rack unit 103 in which the wafer W taken-out by transport arm 102 is disposed; and a transport arm 104 configured to receive wafer W disposed in rack unit 103 and transport received wafer W into a liquid processing apparatus 10. As illustrated in FIG. 1, liquid processing system 100 is also provided with a plurality of (eight in the aspect illustrated in FIG. 1) liquid processing apparatuses 10.

Further, in the side wall of each of liquid processing apparatuses 10, an opening 11 is provided to carry wafer W into a liquid processing chamber 20 or carry wafer W out from liquid processing chamber 20 by transport arm 104. Opening 11 is provided with a shutter 12 configured to open/close opening 11.

Next, a schematic configuration of liquid processing apparatus 10 according to the present exemplary embodiment will be described with reference to FIGS. 2 and 3.

Figure 2:
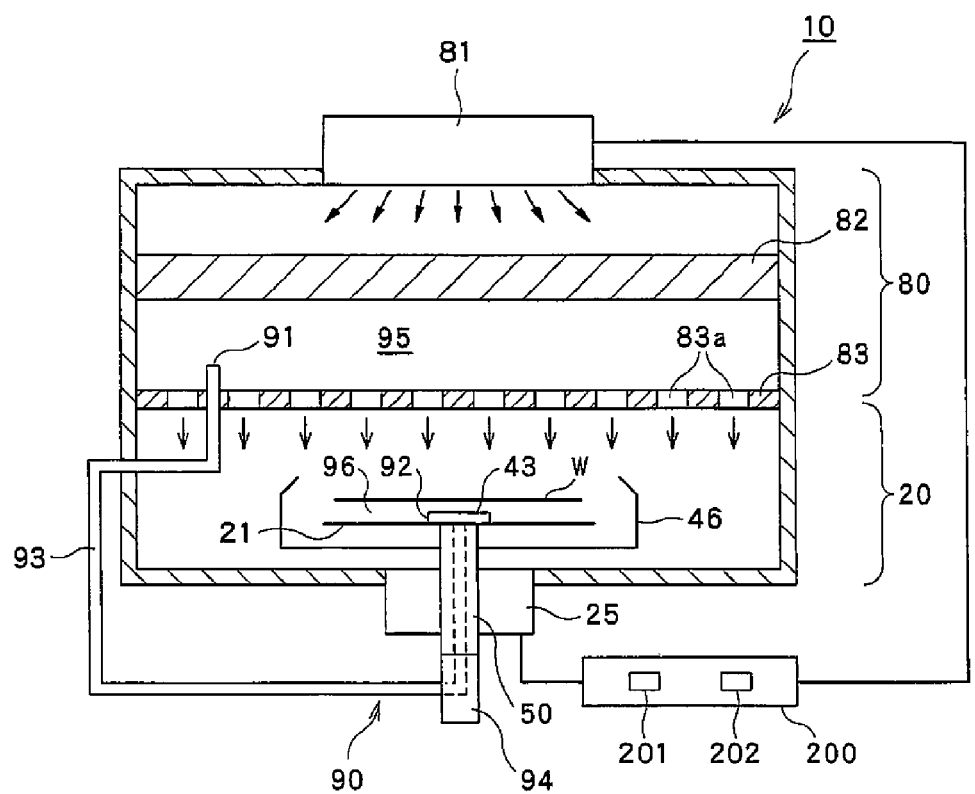
FIG. 2 is a cross-sectional side view illustrating the liquid processing apparatus in the liquid processing system in FIG. 1.

As illustrated in FIG. 2, liquid processing apparatus 10 according to the present exemplary embodiment includes: liquid processing chamber 20 in which wafer W is accommodated and the liquid processing of the accommodated wafer W is performed; and an air hood provided above liquid processing chamber 20 and configured to supply a clean air into liquid processing chamber 20 as a downflow.

A substrate holding unit 21 that holds and rotates wafer W horizontally is provided within liquid processing chamber 20. A ring type drain cup 46 (described below) is provided to surround the circumference of wafer W held by substrate holding unit 21. Drain cup 46 is provided to recover and drain the processing liquid supplied to wafer W when the liquid processing is performed.

Next, each component of liquid processing apparatus 10 will be described with reference to FIGS. 3 to 6 in detail.

Figure 3:
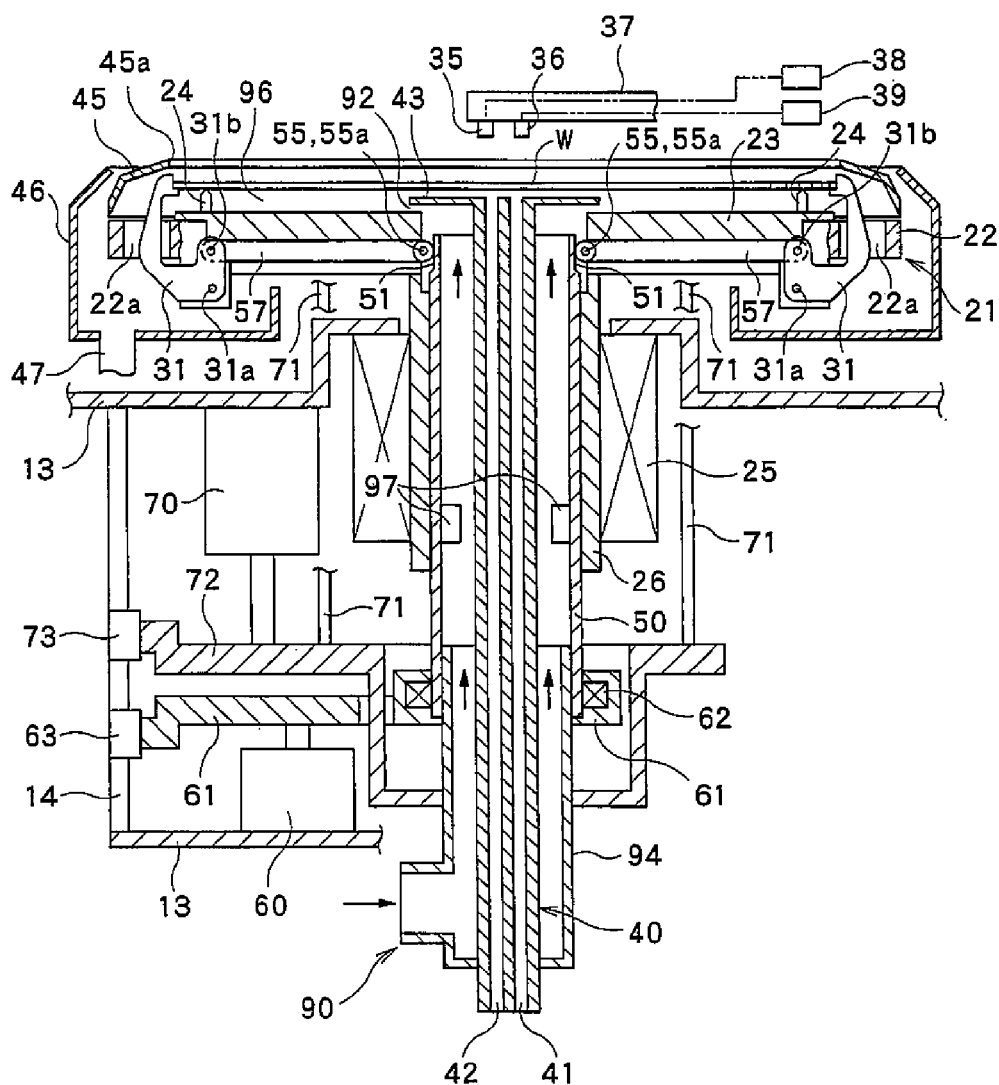
FIG. 3 is a vertical cross-sectional view illustrating a substrate holding unit and components disposed at the surroundings of the substrate holding unit in the liquid processing apparatus illustrated in FIG. 2 in a state where an elevating tube member is located at a descent position.

As illustrated in FIG. 3, substrate holding unit 21 includes: a chuck base (holding base) 22 configured to hold wafer W to be spaced apart from chuck base 22 horizontally; a lift base 23 provided on chuck base 22 to be capable of ascending/descending; a plurality of lift pins 24 provided on lift base 23 and configured to support the bottom surface of wafer W; and three chuck members (engagement members) 31 pivotably provided on chuck base 22.

Figure 5:
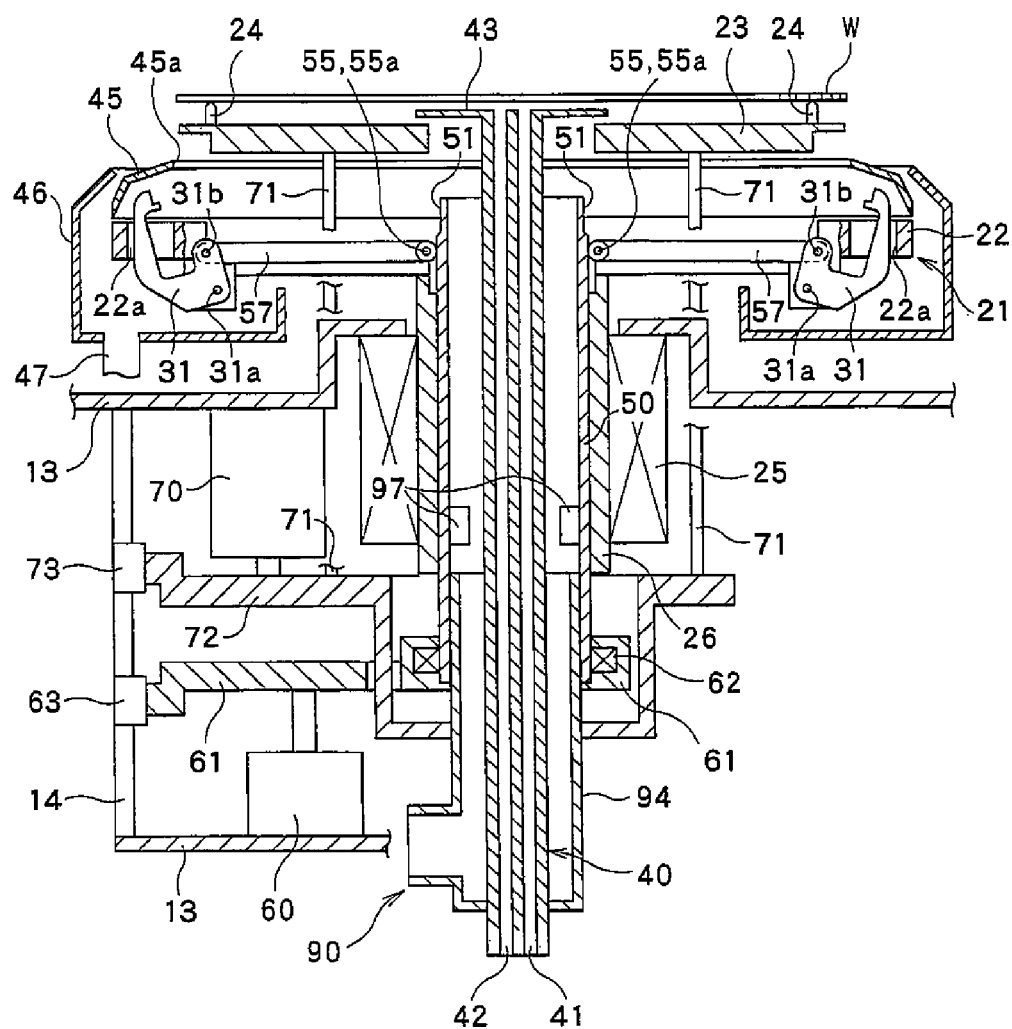
FIG. 5 is a vertical cross-sectional view illustrating the substrate holding unit and the components disposed at the surroundings of the substrate holding unit in the liquid processing apparatus illustrated in FIG. 2 in a state where the elevating tube member is located at an ascent position.

Lift base 23 is pushed up by lift rods 71 (described below) and detached from chuck base 22 to be raised. That is, lift base 23 descends/ascends between a descent position disposed on chuck base 22 and an ascent position above the descent position. In particular, when lift base 23 is located in the descent position, a rotation cup 45 (described below) is disposed to surround the circumference of wafer W (see, e.g., FIGS. 3 and 5). In addition, as illustrated in FIG. 5, when lift base 23 is located at the ascent position, wafer W is located above rotation cup 45 and carried in/out by transport arm 104 (see, e.g., FIG. 1). Further, although three lift pins 24 are provided in the circumferential direction with an equal interval, only two lift pins 24 are depicted in FIG. 3 for the convenience.

Figure 4:
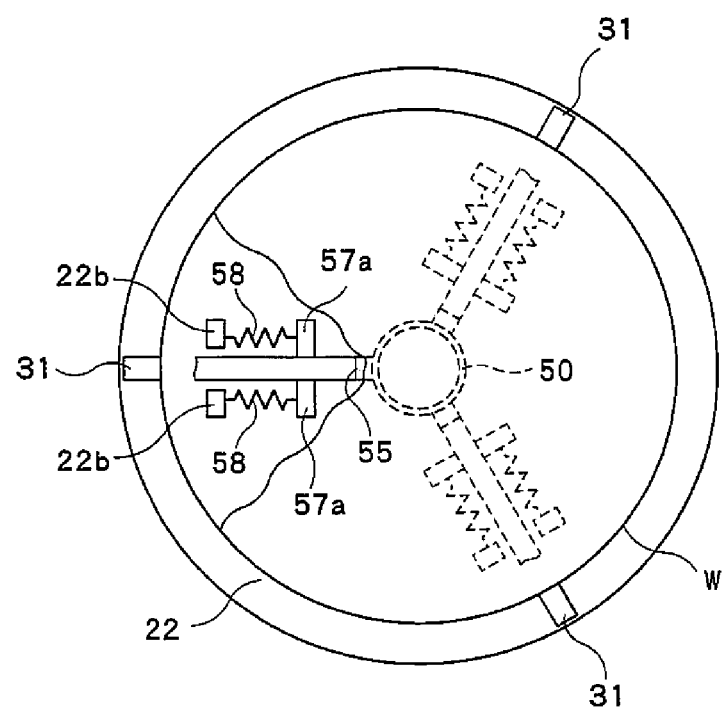
FIG. 4 is a plan view illustrating the substrate holding unit on which a wafer is held.

Chuck members 31 are arranged to be spaced apart from each other in the circumferential direction of wafer W, as illustrated in FIG. 4. Wafer W is stably held by these three chuck members 31. In addition, although chuck members 31 may be arranged with an equal interval in the circumferential direction of wafer W, the present disclosure is not limited thereto as long as wafer W may be stably held.

Each of chuck members 31 is pivoted (moved) between an engaging position where the chuck member is engaged with the peripheral edge of wafer W and a releasing position where wafer W is released. That is, each of chuck members 31 is attached to chuck base 22 to be pivoted around a pivot position 31a. At the engaging position, each chuck member comes into contact with the circumferential surface of wafer W and comes into contact with the peripheral edge of the bottom surface of wafer W, thereby being engaged with the wafer W. In addition, each of chuck members 31 is formed to extend upward through corresponding one of peripheral penetrating holes 22a formed in the peripheral portion of chuck base 22. Further, while chuck members 31 are being engaged with the peripheral edge of wafer W, thereby holing wafer W, wafer W is slightly spaced apart from lift pins 24.

Such substrate holding unit 21 is configured to be rotated together with wafer W. That is, liquid processing apparatus 10 includes: a frame 13 fixed to liquid processing chamber 20; and a rotation driving unit 25 (for example, rotation motor) attached to frame 13 and configured to rotate substrate holding unit 21. Rotation driving unit 25 includes a cylindrical rotating shaft 26 that is connected to chuck base 22. Accordingly, chuck base 22 is rotated by rotation driving unit 25. Further, when lift base 23 is located at the descent position disposed on chuck base 22, lift base 23 is rotated together with chuck base 22 by being engaged with chuck base 22 in the rotation direction. As such, wafer W held on substrate holding unit 21 is adapted to be rotated horizontally.

As illustrated in FIG. 3, a top side processing liquid nozzle 35 that supplies a processing liquid to the top surface of wafer W is provided above wafer W held by substrate holding unit 21. Top side processing liquid nozzle 35 is supported by a nozzle support arm 37. Further, top side processing liquid nozzle 35 is connected to a processing liquid supply unit 38. Processing liquid supply unit 38 is configured to selectively supply an acidic processing liquid (e.g., diluted hydrofluoric acid (DHF)), an alkaline processing liquid (e.g., SC1 solution made by mixing, for example, ammonium hydroxide and hydrogen peroxide) and a rinse liquid (e.g., deionized water) to top side processing liquid nozzle 35.

Nozzle support arm 37 is provided with a top side dry gas nozzle 36 adjacent to top side processing liquid nozzle 35. Top side dry gas nozzle 36 is connected to a dry gas supply unit 39. Dry gas supply unit 39 is configured to supply a dry gas (e.g., inert gas such as $N_2$ gas) to top side dry gas nozzle 36.

In addition, an elevating shaft member 40 that selectively supplies a processing liquid or a dry gas to the bottom surface of wafer W is provided below wafer W held by chuck base 22. That is, elevating shaft member 40 includes a bottom side processing liquid supply pipe 41 that supplies a processing liquid to the bottom surface of wafer W held by substrate holding unit 21 and a bottom side dry gas supply pipe 42 that supplies a dry gas to the bottom surface of wafer W. In particular, bottom side processing liquid supply pipe 41 is connected to processing supply unit 38 as described above, and acidic processing liquid, alkaline processing liquid and rinse liquid are selectively supplied in synchronization with top side processing liquid nozzle 35. Bottom side dry gas supply pipe 42 is dry gas supply unit 39 as described above, and dry gas is supplied in synchronization with top side dry gas nozzle 36.

Elevating shaft member 40 extends to a position adjacent to the bottom surface of wafer W through a through hole formed at the center of lift base 23 and a through hole formed at the center of chuck base 22. As described above, the processing liquid or the dry gas is supplied to the bottom surface of wafer W from bottom side processing liquid supply pipe 41 and bottom side dry gas supply pipe 42. Further, elevating shaft member 40 is configured to ascend/descend by interlocking with lift base 23, as described below. That is, when lift base 23 is pushed up by lift rods 71 to be described below, elevating shaft member 40 also ascends.

A head member 43 is provided at the upper end of elevating shaft member 40. Head member 43 changes the air flowing direction from an elevating tube member 50 as an air supply path 90 to be described below to the diametric direction of wafer W so that the air is supplied to a space 96 formed between the bottom surface of wafer W and lift base 23. A supply port 92 of air supply path 90 to be described below is formed by head member 43 and lift base 23.

A ring type rotation cup 45 is provided diametrically around wafer W held by substrate holding unit 21. Rotation cup 45 is rotated integrally with chuck base 22 by a connection part (not illustrated). Rotation cup 45 surrounds wafer W held by substrate holding unit 21 around the wafer. For that reason, drain cup 45 may receive the processing liquid scattered laterally from wafer W when the liquid processing of wafer W is performed. Further, rotation cup 45 includes a rotation cup opening 45a which is opened upwardly, and wafer W ascends/descends together with lift base 23 through rotation cup opening 45a when wafer W is carried in/out.

Further, a ring type drain cup (recovery cup) 46 is provided to surround rotation cup 45. Drain cup 46 also surrounds the circumference of substrate holding unit 21 (more specifically, the circumference of rotation cup 45), thereby receiving the processing liquid scattered laterally from wafer W circumference. That is, the processing liquid scattered laterally from a gap between rotation cup 45 and chuck base 22 is recovered by drain cup 46. Further, drain cup 46 is positionally fixed within liquid processing chamber 20 not to be rotated.

A discharging unit 47 that discharges the atmospheric gas within liquid processing chamber 20 is provided below drain cup 46. Specifically, the processing liquid recovered by drain cup 46 is discharged together with the atmospheric gas within liquid processing chamber 20. Discharging unit 47 is connected to a gas/liquid separation unit (not illustrated), and thus, the processing liquid and the gas discharged from discharging unit 47 are separated to be drained and exhausted.

Next, a pivot mechanism that pivots chuck member 31 between the engaging position and the releasing position will be described.

Elevating tube member 50 may be located at a descent position or an ascent position disposed above the descent position. Here, FIG. 3 illustrates a state where elevating tube member 50 is located at the descent position, and FIG. 5 illustrates a state where elevating tube member 50 is located at the ascent position.

That is, elevating tube member 40 ascends/descends between the descent position where chuck member 31 is pivoted to the coupling position and the ascent position where chuck member 31 is pivoted to the releasing position. Further, elevating tube member 50 includes a contact portion 51 (a portion to be contacted) provided on the outer peripheral surface thereof. Contact portion 51 is formed in a concave shape with respect to the outer peripheral surface of elevating tube member 50. In the present exemplary embodiment, concave-shaped contact portion 51 extends to the upper end of elevating tube member 50, and is illustrated in a step shape in FIG. 3.

As illustrated in FIG. 3, each of chuck members 31 is connected to a contact unit 55 that is in contact with the outer peripheral surface of elevating tube member 50. When contact unit 55 is in contact with contact portion 51, each of chuck members 31 is pivoted to the engaging position. Specifically, one end of a link member 57 is coupled to chuck member 31 with a link pin 31b. Link pin 31b is disposed above a pivot point 31a of chuck member 31. Contact unit 55 as described above is connected to the other end of link member 57. Further, link member 57 is biased against elevating tube member 50 by a biasing force of a spring member 58 (see, e.g., FIG. 4) as described below in detail. Contact unit 55 includes a cylindrical roller 55a which is in the ascending/descending directions on the outer peripheral surface of elevating tube member 50. With this configuration, when contact unit 55 in contact with the outer peripheral surface of elevating tube member 50 is moved to and contacted with concave-shaped contact portion 51 by the ascending/descending of elevating tube member 50, link member 57 and link pin 31b are moved toward elevating tube member 50. Therefore, chuck member 31 is pivoted around pivot point 31a (clockwise in FIG. 3) to be located at the engaging position.

As illustrated in FIG. 4, roller 55a is biased against elevating tube member 50 by spring member (biasing force giving mechanism) 58 that serves as a compression spring. That is, one end of spring member 58 is connected to a link side end 57a fixed to link member 57, and the other end is connected to a base side end 22b fixed to chuck base 22. In this manner, spring member 58 biases roller 55a against elevating tube member 50 via link member 57. As a result, each of chuck members 31 is biased toward the engaging position to hold wafer W.

As illustrated in FIG. 4, in the present exemplary embodiment, each of link members 57 is connected to a pair of spring members 58, and is interposed between the pair of spring members 58. As such, the movement of contact unit 55 and link member 57 is facilitated and thus, the pivoting of chuck member 31 is facilitated as well.

When elevating tube member 50 is located at the descent position by the biasing force of spring member 58, roller 55a is moved to contact portion 51. Therefore, three chuck members 31 are located at their engaging positions, respectively, to hold wafer W, as illustrated in FIG. 3. When elevating tube member 50 is located at the ascent position, roller 55a is seated on the outer peripheral surface of elevating tube member 50 and each of chuck members 31 is located at the releasing position, as illustrated in FIG. 5.

Elevating tube member 50 is configured to ascend/descend by an elevating cylinder (elevation driving unit) 60. That is, elevating tube member 50 is connected to elevating cylinder 60 fixed to frame 13 through elevation connecting member 61, and ascends/descends via elevation connecting member 61. In addition, elevating shaft member 40 extends through the inner side of cylindrical elevating tube member 50, and elevating tube member 50 is also configured to be capable of ascending/descending with respect to elevating shaft member 40.

Figure 6:
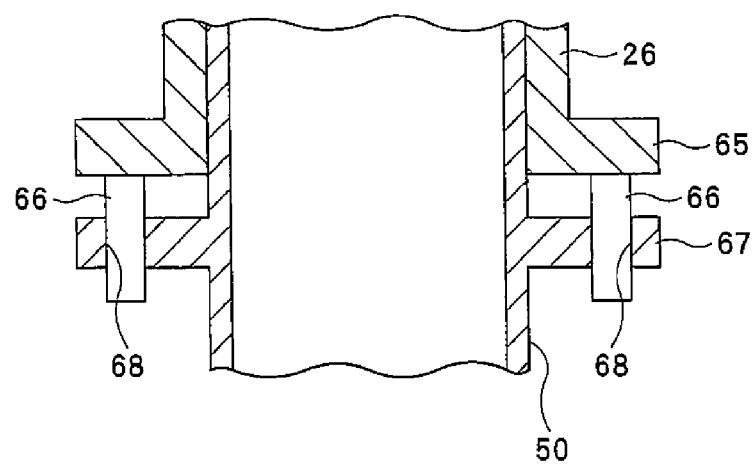
FIG. 6 is a view illustrating a connection part of a rotating shaft of a rotation driving unit and the elevating tube member in detail.

Elevating tube member 50 is connected to rotating shaft 26 of rotation driving unit 25. Specifically, as illustrated in FIG. 6, a rotating shaft flange 65 is fixed to the lower end of rotating shaft 26, and a plurality of insertion pins 66 extend from rotating shaft flange 65 downwardly. An elevating tube flange 67 is fixed to elevating tube member 50, and elevating tube flange 67 is provided with a plurality of insertion holes 68 in which the insertion pins 66 are slidably fit, respectively. Elevating tube member 50 is rotated together with rotating shaft 26 by fitting each of insertion pins 66 with a corresponding insertion hole 68 of elevating tube flange 67, and elevating tube member 50 ascends/descends with respect to rotating shaft 26 as each of insertion pins 66 slides within corresponding insertion hole 68. In this manner, elevating tube member 50 is rotated together with substrate holding unit 21 via rotating shaft 26, and connected to rotating shaft 26 to be capable of ascending/descending. As elevation connecting member 61 is connected to elevating tube member 50 using a bearing 62, elevation connecting member 61 does not rotate together with elevating tube member 50. Therefore, elevating tube member 50 is configured to be freely rotatable with respect to elevation connecting member 61.

Elevation connecting member 61 is provided with an elevating guide member 63. Elevating guide member 52 is guided on a guide rail 14 fixed to frame 13 and ascends/descends along guide rail 14. As a result, elevating tube member 50 may smoothly ascend/descend in the vertical direction.

Next, a mechanism that pushes up lift base 23 will be described.

Lift base 23 is configured to ascend/descend by a lift cylinder (lift driving unit) 70 fixed to frame 13. That is, lift rod 71 is pushed up by lift cylinder 70, and thus, lift base 23 is detached from chuck base 22 to be raised. Lift rod 71 is connected to lift cylinder 70 through a lift connecting member 72. More specifically, the lower end of lift rod 71 is fixed to lift connecting member 72, and the upper end of lift rod 71 is capable of being contacted with the bottom surface of lift base 23. That is, when lift base 23 is located at the descent position, the upper end of lift rod 71 is spaced apart from the bottom surface of lift base 23, but the upper end is contacted with the bottom surface of lift base 23 when lift base 23 is raised from chuck base 22. Lift rod 71 extends upwardly through a through hole provided in chuck base 22. As such, lift cylinder 70 raises lift base 23 from chuck base 22 via lift rod 71.

Lift connecting member 72 is connected to an elevating supply pipe 94 of air supply path 90 (described below), and elevating shaft member 40 is fixed to elevating supply pipe 94. As such, lift cylinder 70 raises elevating shaft member 40 together with head member 43 provided at the upper end thereof via lift connecting member 72 and elevating supply pipe 94 when lift base 23 is raised. Elevating supply pipe 94 and elevating tube member 50 freely ascend/descend in relation to each other. That is, the outer surface of elevating supply pipe 94 is slidably fitted in the inner surface of elevating tube member 50. As a result, elevating tube member 50 is configured to freely ascend/descend and be freely rotated with respect to elevating supply pipe 94.

Further, lift connecting member 72 is provided with a lift guide member 73. Lift guide member 73 is guided on a guide rail 14 fixed to frame 13 and ascends/descends along guide rail 14. As a result, lift rod 71 and lift base 23 may smoothly ascend/descend in the vertical direction.

Next, referring to FIG. 2, an air hood 80 will be described.

Air hood 80 is provided with a fan (air supply unit) 81 that is disposed above wafer W held by substrate holding unit 21 and sends (supplies) air toward wafer W. Further, within air hood 80, a filter member 82 is provided below fan 81. Filter member 82 removes for example, dusts from air sent from fan 81 to clean the air. As for filter member 82, an ultra low penetration air filter (ULPA filter) may be appropriately used. Further, a baffle member 83 is provided below filter member 82 to be spaced apart from filter member 82. Baffle member 83 distributes the air cleaned by filter member 82 evenly and forms a downflow onto wafer W. As for baffle member 83, a punched plate including a plurality of openings 83a may be appropriately used.

Next, air supply path 90 will be described that supplies air to a space 96 formed between the bottom surface of wafer W and lift base 23.

As illustrated in FIG. 2, air supply path 90 is provided that inhales air supplied from fan 81 and supplies the air to space 96 formed between the bottom surface of wafer W held by substrate holding unit 21 and lift base 23. Since the pressure within space 96 is lowered to a negative pressure by centrifugal force while wafer W is being rotated, the air supplied from fan 81 is inhaled by air supply path 90 and is supplied to space 96 due to a difference between the pressure of space 96 and the pressure in a suction port 91 to be described below.

In the present exemplary embodiment, air supply path 90 is configured to inhale the air of air supply space 95 formed between filter member 82 and baffle member 83. That is, air supply path 90 includes a suction port 91 which is disposed in air supply space 95 and configured to inhale the air within air supply space 95 and a supply port 92 which is disposed space 96 formed at the bottom side of wafer W and supplies the air inhaled from suction port 91 to space 96. Suction port 91 is disposed in the outer side of drain cup 46 when viewed in a plan view (when wafer W is viewed from the top, in FIG. 2).

In the present exemplary embodiment, as illustrated in FIGS. 2 and 3, air supply path 90 is mainly configured by a chamber side supply pipe 93 having suction port 91 provided at one end thereof, above-described elevating supply pipe 94 connected to chamber side supply pipe 93 to be capable of ascending/descending, cylindrical elevating tube member 50 (supply pipe) extending through the inner side of cylindrical rotating shaft 26, and head member 43 provided at the upper end of elevating shaft member 40. That is, the air inhaled from suction port 91 is sent to supply port 92 through chamber side supply pipe 93, elevating supply pipe 94 and elevating tube member 50. Chamber side supply pipe 93 is so flexible that it may follow the ascending/descending of elevating supply pipe 94.

Chamber side supply pipe 93 is formed to protrude to the outside of liquid processing chamber 20 through the inside of liquid processing chamber 20 from air supply space 95. In addition, a portion within air hood 80 and a portion within liquid processing chamber 20 in chamber side supply pipe 93 are disposed outside drain cup 46 when viewed in a plan view. As describe above, chamber side supply pipe 93 is suppressed from being disposed in an area above drain cup 46, and the downflow of clean air supplied to an area surrounded by drain cup 46 is suppressed from being disrupted.

As described above, elevating shaft member 40 including bottom side processing liquid supply pipe 41, which supplies processing liquid to the bottom surface of wafer W, is provided inside elevating supply pipe 94 and elevating tube member 50. A space formed between the inner surface of elevating supply pipe 94, the inner surface of elevating tube member 50, and the outer surface of elevating shaft member 40 becomes a flow path of the supplied air.

As illustrated in FIG. 3, wings (swirl generating mechanism) 97 that generate a swirl in the air passing through the inside of elevating tube member 50 are provided on the inner surface of elevating tube member 50. Since elevating tube member 50 is rotated together with wafer W, wings 97 are rotated while wafer W is being rotated. As a result, swirl may be generated in the air passing through the inside of elevating tube member 50 and air may be sent forcibly to space 96 formed at the bottom side of wafer W, thereby increasing the flow rate of air supplied to space 96. For that reason, the pressure of space 96 may be suppressed from being excessively lowered. In particular, although the pressure of space 96 tends to be lowered by centrifugal force as the number of revolutions of wafer W increases, but the flow rate of air supplied to space 96 may increase forcibly by intensifying the swirl according to the number of revolutions of wafer W. Therefore, the pressure of space 96 may be further suppressed from being excessively lowered.

Further, supply port 92 of air supply path 90 is formed by head member 43 provided at the upper end of elevating shaft member 40 and lift base 23. Head member 43 changes the flowing direction air sent from elevating tube member 50 to a diametrical direction of wafer W so as to supply air to space 96 formed at the bottom side of wafer W.

As described above, elevating supply pipe 94 is connected to lift connecting member 72 and ascends/descends by lift cylinder 70. Elevating supply pipe 94 freely ascends/descends with respect to elevating tube member 50, as described above. As a result, elevating supply pipe 94 ascends/descends together with lift base 23.

The cross-section of the flow path of suction port 91 of air supply path 90 is configured to be the same as the cross-section of the flow path of supply port 92 (specifically, the minimum cross-section of the flow path in supply port 92). Due to this, the flow rate of air may be suppressed from being lowered by a pressure loss, and the flow of atmospheric gas around suction port 91 may be suppressed from being scattered. In addition, "the same" is not limited to a meaning of the same in a strict sense, but may be used as a meaning that includes a manufacturing error to a certain degree that may be regarded as the same.

As illustrated in FIG. 2, liquid processing apparatus 10 includes a controller (control unit) 200 that performs an overall control of the entire operations thereof. Controller 200 controls the operations of all the functional components (for example, substrate holding unit 21, rotation driving unit 25, elevating cylinder 60, lift cylinder 70 and fan 81). Controller 200 may be implemented using, for example, a general purpose computer as a hardware and a program (for example, an apparatus control program and a processing recipe) to operate the computer as a software. The software may be stored in a storage medium such as, for example, a hard disc drive which is fixedly provided in the computer, or in a storage medium such as, for example, a CD-ROM, a DVD, and a flash memory which are removably set in the computer. Such a storage medium is indicated by reference numeral 201 in FIG. 2. A processor 202 calls and executes a predetermined processing recipe from storage medium 201 based on, for example, commands from a user interface (not illustrated) as needed, and as a result, each functional component of liquid processing apparatus 10 operates to perform a predetermined processing under the control of controller 200. Controller 200 may be a system controller that controls the entirety of liquid processing system 100 as illustrated in FIG. 1.

Figure 7:
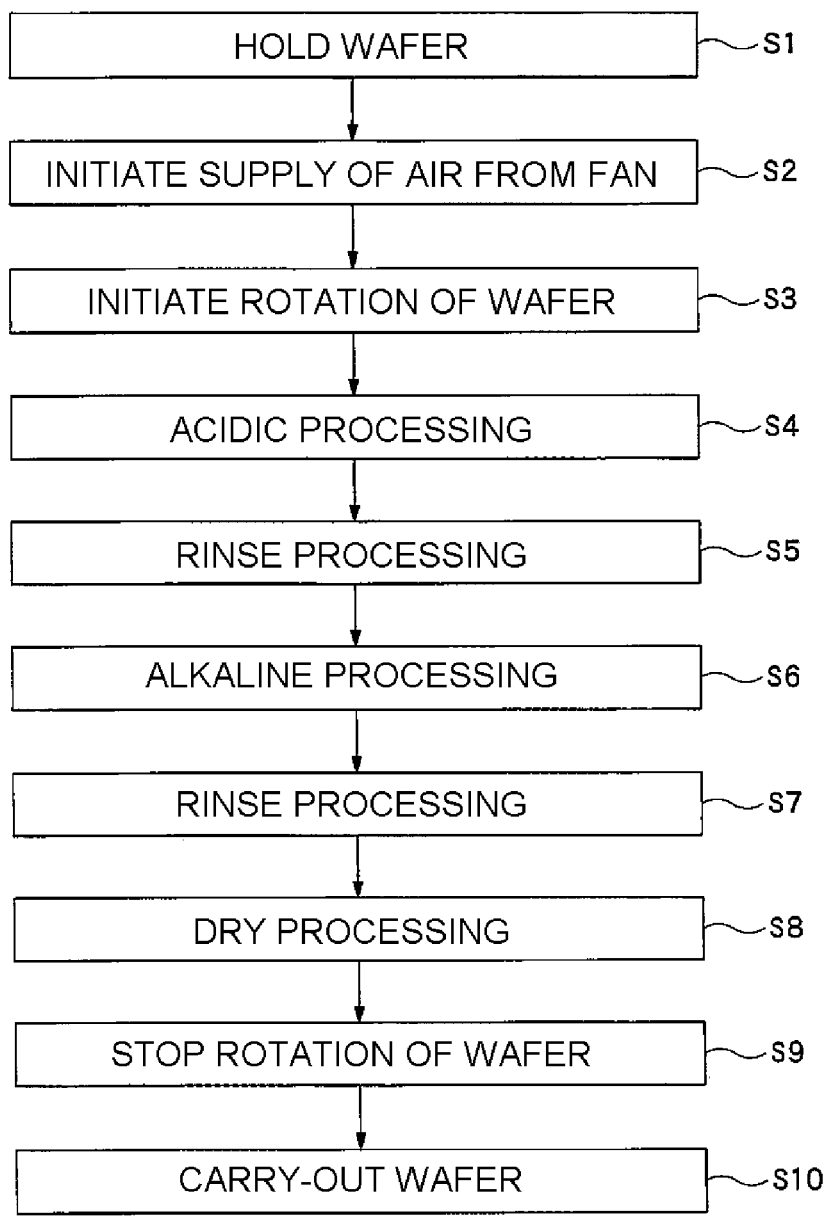
FIG. 7 is a flow chart illustrating a liquid processing method according to the present exemplary embodiment.

Next, a cleaning method of wafer W using above-described liquid processing apparatus 10 will be described with reference to FIG. 7. A series of cleaning processes described below are performed by controlling each of functional components of liquid processing apparatus 10 by controller 200.

First, wafer W is held on substrate holding unit 21 within liquid processing chamber 20 (step S1).

In this case, lift base 23 is raised to the ascent position first through lift rod 71 by lift cylinder 70. As a result, lift base 23 is located at a position higher than rotation cup 45 and drain cup 46. In this case, lift base 23 is raised together with elevating supply pipe 94 and elevating shaft member 40, and elevating tube member 50 is raised to the ascent position. In addition, shutter 12 is opened which is provided in opening 11 of liquid processing chamber 20 (see, e.g., FIG. 1).

Next, wafer W is carried into liquid processing chamber 20 through opening 11 by transport arm 104 from the outside of liquid processing apparatus 10. Wafer W carried into liquid processing chamber 20 is moved to and mounted on lift pins 24 on lift base 23. After wafer W is disposed on lift pins 24, transport arm 104 retreats from liquid processing chamber 20.

Next, air supply is initiated from fan 81 (step S2). As a result, cleaned air is supplied into liquid processing chamber 20 from air hood 80 as a downflow. That is, the air sent from fan 81 is cleaned by filter member 82 and supplied toward wafer W by baffle member 83 as the downflow. The supplied air is discharged from discharging unit 47, and thus, the substitution of the atmosphere gas within liquid processing chamber 20 is performed. In addition, in each process indicated as below, the cleaned air is continuously supplied as well from air hood 80, and thus, mists of acidic processing liquid or mists of alkaline processing liquid are suppressed from being stayed within liquid processing chamber 20.

Next, lift base 23 is lowered to the descent position by lift cylinder 70. As a result, lift base 23 is disposed on chuck base 22. Then, lift cylinder 70 is continuously driven, and lift rod 71 and lift connecting member 72 further descend. As a result, the upper end of lift rod 71 is spaced apart from the bottom surface of lift base 23.

When lift base 23 is lowered, elevating tube member 50 is lowered to the descent position by elevating cylinder 60. At this time, rollers 55a connected to chuck members 31 are moved to and contacted with concave-shaped contact portions 51 of elevating tube member 50 by the biasing force of spring member 58. As a result, chuck members 31 are pivoted from the releasing position to the engaging position to be engaged with the peripheral edge of wafer W, and wafer W is transferred to chuck members 31 from lift pins 24.

After wafer W is held by chuck member 31 of substrate holding unit 21, the rotation of chuck base 22 of substrate holding unit 21 is initiated by rotation driving unit 25 (step S3), and is accelerated until the rotating speed of wafer W becomes a predetermined rotating speed. As described above, wafer W held by three chuck members 31 is rotated at the predetermined rotating speed. At this time, chuck base 22 is rotated by rotation driving unit 25 and via rotating shaft 26, and lift base 23 disposed on chuck base 22 is also rotated, and elevating tube member 50 connected to rotating shaft 26 is also rotated synchronously.

When substrate holding unit 21 that holds wafer W is rotated, air is discharged diametrically from space 96 formed between the bottom surface of wafer W and lift base 23 to the circumference thereof by centrifugal force, and the pressure at space 96 is lowered. For this reason, a clean air is inhaled to suction port 91 of air supply path 90 by a required amount from air supply space 95 formed between filter member 82 and baffle member 83 within air hood 80. The inhaled air flows to supply port 92 through chamber side supply pipe 93, elevating supply pipe 94 and elevating tube member 50, and is supplied from supply port 92 to space 96. As such, the pressure of space 96 is suppressed from being excessively lowered. Specifically, according to the present exemplary embodiment, since wings 97 are provided on the inner surface of elevating tube member 50, the flow rate of the air supplied to space 96 may be increased forcibly according to the number of revolutions of wafer W, thereby further suppressing the pressure at space 96 from being excessively lowered. In addition, the pressure of space 96 may not be excessively lowered, and the pressure may become a slight negative pressure to such an extent that wafer W is not flexed or damaged. As a result, wafer W may be pulled to space 96 side while being rotated, thereby holding wafer W stably by chuck members 31. Also in each process as described below, while wafer W is being rotated, the cleaned air is continuously supplied to space 96 by air supply path 90.

After the rotating speed of wafer W reaches a predetermined rotating speed, an acidic processing of wafer W (for the convenience, a liquid processing using an acidic processing liquid will be referred to as an "acidic processing") is performed (step S4). That is, in a state where wafer W is rotated at a predetermined rotating speed, an acidic processing liquid is sent to top side processing liquid nozzle 35 and a bottom side processing liquid supply pipe 41 from processing liquid supply unit 38, and thus, acidic processing liquid is supplied to the top surface of wafer W from top side processing liquid nozzle 35 and is supplied to the bottom surface of wafer W from bottom side processing supply pipe 41. Therefore, wafer W is subjected to an acidic processing. The acidic processing liquid supplied to the top surface and the bottom surface of wafer W, is scattered diametrically to the circumference of wafer W by the centrifugal force caused by the rotation of wafer W, and is received in rotation cup 45. The acidic processing liquid received by rotation cup 45 flows diametrically to the circumference through a gap between rotation cup 45 and chuck base 22. Then, the liquid is recovered by drain cup 46. The recovered acidic processing liquid is sent to discharging unit 47 and discharged together with the atmosphere gas within liquid processing chamber 20.

After the acidic processing of wafer W is terminated, wafer W is rinsed (step S5). In this case, deionized water (DIW) is sent to top side processing liquid nozzle 35 and bottom side processing supply pipe 41 from processing liquid supply unit 38. Therefore, the deionized water is supplied to the top surface of wafer W from top side processing liquid nozzle 35 and to the bottom surface of wafer W from bottom side processing liquid supply pipe 41.

After the rinse processing of wafer W is terminated, wafer W is subjected to an alkali processing (for the convenience, a liquid processing by alkaline processing liquid will be referred as an "alkali processing") (step S6). At this time, as in the acidic processing from processing liquid supply unit 38, an alkaline processing liquid is supplied to the top surface of wafer W via top side processing liquid nozzle 35 and is supplied to the bottom surface of wafer W via bottom side processing liquid supply pipe 41. The alkaline processing liquid supplied to the top surface and the bottom surface of wafer W is recovered by drain cup 46, and sent to discharging unit 47 to be discharged.

Continuously, wafer W is rinsed as in step S5 (step S7).

After the rinse processing of wafer W is terminated, wafer W is dried (step S8). At this time, a dry gas is supplied to the top surface of wafer W via top side dry gas nozzle 36 and is supplied to the bottom surface of wafer W via bottom side dry gas supply pipe 42 from dry gas supply unit 39. The dry gas supplied to the top surface and the bottom surface of wafer W is recovered by drain cup 46 and sent to discharging unit 47 to be discharged as the acidic processing liquid and alkaline processing liquid.

After the dry processing of wafer W is terminated, the rotating speed of wafer W is reduced and the rotation of wafer W is stopped (step S9). As a result, the negative pressure state of space 96 formed at the bottom side of wafer W is released, and the supply of air to space 96 by air supply path 90 is stopped.

Then, wafer W is taken out from substrate holding unit 21 to be carried out from liquid processing apparatus 20 (step S10).

In that case, elevating tube member 50 is raised first from the descent position to the ascent position by elevating cylinder 60. Lift base 23 is raised from the descent position thereof to the ascent position by lift cylinder 70. As a result, wafer W is released from chuck members 31 and disposed on lift pins 24. In addition, wafer W is located in an upper position than rotation cup 45 and drain cup 46 according to the ascending of lift base 23. In addition, shutter 12 is opened which is provided in opening 11 of liquid processing chamber 20 (see, e.g., FIG. 1). Then, transport arm 104 enters liquid processing chamber 20 from the outside of liquid processing apparatus 10 through opening 11, wafer W disposed on lift pins 24 is moved to and mounted on transport arm 104, and wafer W is carried out to the outside of liquid processing apparatus 10. As a result, a series of liquid processings of wafer W according to the present exemplary embodiment are completed.

According to the present exemplary embodiment, while rotating wafer W, the pressure of space 96 formed between the bottom surface of wafer W and lift base 23 may be lowered to a negative pressure by centrifugal force. As a result, the cleaned air may be inhaled from air supply space 95 by air supply path 90 and supplied to space 96 according to the pressure difference between space 96 and air supply space 95 formed between filter member 82 and baffle member 83 within air hood 80. Therefore, the pressure at space 96 formed at the bottom side of wafer W may be suppressed from being excessively lowered, and wafer W may be suppressed from being flexed or damaged. That is, while wafer W may be flexed or damaged as the pressure at space 96 formed at the bottom side of wafer W is lowered, wafer W may be suppressed from being flexed or damaged because the pressure at space 96 formed at the bottom side of wafer W is suppressed from being excessively lowered according to the present embodiment. Further, since the air supplied from fan 81 to liquid processing chamber 20 is used in order to suppress the pressure at space 96 from being excessively lowered, the operation cost for suppressing the flexure and damage of wafer W may be substantially decreased as compared to a case where, for example, $N_2$ gas is used. As a result, the flexures and damages of wafer W may be suppressed with a low operation cost.

Further, according to the present exemplary embodiment, suction port 91 of air supply path 90 is located in the outside of drain cup 46, when viewed from the top. As a result, the downflow of the cleaned air supplied to an area surrounded by drain cup 46 within liquid processing chamber 20 may be suppressed from being disrupted. For that reason, the cleaned air may be effectively supplied toward wafer W and the atmospheric gas within liquid processing chamber 20 may be effectively substituted.

Further, according to the present exemplary embodiment, the cross section of suction port 91 of air supply path 90 is the same as that of supply port 92. As a result, the flow rate of air may be suppressed from being lowered by the pressure loss, and the flow of the atmosphere around suction port 91 may be suppressed from being disrupted. For that reason, the cleaned air may be effectively supplied toward wafer W and the atmosphere within liquid processing chamber 20 may be effectively substituted.

Further, according to the present exemplary embodiment, air supply path 90 extends through the inner side of cylindrical rotating shaft 26 of rotation driving unit 25. As a result, in space 96 formed at the bottom side of wafer W, air may be supplied to the substantially central portion where pressure is most lowered, and thus, the pressure of space 96 may be effectively suppressed from being excessively lowered.

Further, according to the present exemplary embodiment, bottom side processing liquid supply pipe 41 configured to supply processing liquid to the bottom surface of wafer W is provided inside elevating supply pipe 94 of air supply path 90. As a result, the bottom surface of wafer W may liquid processed, the pressure of space 96 formed at the bottom side of wafer W may be suppressed from being lowered, thereby preventing the flexures and damages of wafer W.

Further, according to the present exemplary embodiment, bottom side processing liquid supply pipe 41 to supply processing liquid to the bottom surface of wafer W is provided inside elevating tube member 50. As a result, the bottom surface of wafer W may be liquid processed, thereby preventing the flexures and damages of wafer W.

Further, according to the present exemplary embodiment, wings 97 to generate the swirl for the air passing through elevating tube member 50 are provided on the inner surface of elevating tube member 50. As a result, the swirl may be strengthened based on the number of revolutions of wafer W, thereby forcibly increasing the flow rate of the air supplied to space 96 formed at the bottom side of wafer W. For that reason, the pressure at space 96 formed at the bottom side of wafer W may be further suppressed from being excessively lowered.

Further, the liquid processing apparatus according to the present exemplary embodiment is not limited to the above aspects, and various modifications may be made thereto.

For example, in the present exemplary embodiment, an example has been described in which suction port 91 of air supply path 90 is located in the outside of drain cup 46 when viewed from the top. However, the present disclosure is not limited thereto, and suction port 91 may be disposed at any position as long as the downflow of the air supplied to the area surrounded by drain cup 46 may be suppressed from being disrupted.

Further, in the present exemplary embodiment, an example has been described in which the cross section of suction port 91 of air supply path 90 is the same as that of supply port 92. However, the present disclosure is not limited thereto, and the cross section of the flow path of suction port 91 may be larger than that of supply port 92. In this case, the flow rate of air by the pressure drop may be further suppressed. Further, if the flow rate of air may be suppressed from being reduced by the pressure loss, the cross section of the flow path of suction port 91 is not limited to the case where the cross section is the same as or larger than that of supply port 92.

Further, in the present exemplary embodiment, an example has been described in which bottom side processing liquid supply pipe 41 is provided in the inside of elevating supply pipe 94 to supply processing liquid to the bottom surface of wafer W. However, the present disclosure is not limited thereto as long as air is supplied to space 96 formed at the bottom side of wafer W. Further, although an example has been described in which air supply path 90 is mainly constituted by chamber side supply pipe 93, elevating supply pipe 94, elevating tube member 50, and head member 43, the present disclosure is not limited thereto as long as an air is supplied to space 96.

Further, in the present exemplary embodiment, an example has been described in which wings 97 are provided on the inner surface of elevating tube member 50 to generate the swirl for the air passing through elevating tube member 50, thereby forcibly increasing the flow rate of the air supplied to space 96 formed at the bottom side of wafer W. However, such wings 97 may not be provided. In this case, since the pressure difference between space 96 and suction port 91 is increased due to the increase of the number of revolutions of wafer W, the flow rate of the air supplied to space 96 may be increased naturally. Therefore, the pressure of space 96 may be further suppressed from being excessively lowered.

Further, instead of that wing 97 configured to generate swirl in the air passing through elevating tube member 50 is provided on the inner surface of elevating tube member 50, controller 200 may control fan 81 in such a manner that the flow rate of the air supplied from fan 81 is increased as the number of revolutions of wafer W held by substrate holding unit 21 is increased. In this case, the pressure of air supply space 95 is increased and the number of revolutions of wafer W is increased, and thus, the pressure at space 96 formed at the bottom side of wafer W is lowered. Accordingly, the pressure difference between air supply space 95 and space 96 may be increased. For that reason, the pressure of space 96 may be further suppressed from being excessively lowered by increasing the supply flow rate of the air supplied to space 96. Further, when fan 81 is controlled as described above, the flow rate of the air supplied from fan 81 may be decreased as the number of revolutions of wafer W is decreased. Accordingly, the pressure at space 96 may be maintained at a negative pressure. Further, the number of revolutions of wafer W may be considered to be the same as the number of revolutions of rotating shaft 26 measured by an encoder (not illustrated) accommodated in rotation driving unit 25, and the measured number of revolutions is transmitted to controller 200 as a signal. Controller 200 transmits the signal to fan 81 to adjust the flow rate based on the signal indicating the transmitted number of revolutions, and a desired flow rate of air from fan 81 is supplied toward wafer W. In addition, in this case, a pressure sensor (not illustrated) configured to detect the pressure of air supply space 95 may be provided in air supply space 95, so that the flow rate of the air supplied from fan 81 may be adjusted while monitoring the pressure of air supply space 95.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
   a liquid processing chamber configured to accommodate a substrate;
   a substrate holding unit configured to be rotated and hold the substrate from a bottom side thereof with the substrate being spaced apart horizontally;
   a rotation driving unit configured to rotate the substrate holding unit;
   a nozzle configured to supply processing liquid to the substrate held by the substrate holding unit;
   an air hood having an air supply unit provided above the substrate held by the substrate holding unit and configured to supply air into the liquid processing chamber;
   an air supply path having a chamber side supply pipe which includes a suction port that inhales air supplied from the air supply unit and configured to supply the air inhaled from the suction port to a space formed between the substrate holding unit and a bottom surface of the substrate held by the substrate holding unit; and
   a recovery cup provided to surround the substrate holding unit and configured to recover the processing liquid scattered laterally from the substrate to a circumference of the substrate holding unit,
   wherein the suction port of the air supply path is disposed in an outside and above of the recovery cup within the air hood, and
   at least a portion of the chamber side supply pipe existing within the air hood is disposed outside the recovery cup when viewed in a plan view.

2. The liquid processing apparatus of claim 1, wherein both of the air supply path and the suction port of the air supply path are disposed around the outside of the recovery cup when viewed from the top.

3. The liquid processing apparatus of claim 2, further comprising:
   a filter member configured to clean the air supplied from the air supply unit; and
   a baffle member provided to be spaced apart from the filter member and configured to distribute the air cleaned by the filter member evenly toward the substrate held by the substrate holding unit,
   wherein the suction port of the air supply path is disposed in a space formed between the filter member and the baffle member.

4. The liquid processing apparatus of claim 2, wherein the rotation driving unit further includes a cylindrical rotating shaft, and
   the air supply path includes a supply pipe that passes through an inner side of the rotating shaft.

5. The liquid processing apparatus of claim 4, wherein a bottom side processing liquid supply pipe that supplies processing liquid to the bottom surface of the substrate held by the substrate holding unit is provided inside the supply pipe.

6. The liquid processing apparatus of claim 5, wherein the air supply path further includes a supply port that supplies the air inhaled from the suction port to the space formed at the bottom side of the substrate, and
   the cross-section of the flow path of the suction port of the air supply path is the same as or larger than that of the supply port.

7. The liquid processing apparatus of claim 6, wherein the supply pipe of the air supply path is connected to the rotating shaft of the rotation driving unit, and
   a generating mechanism is provided on the inner surface of the supply pipe for generating a swirl for the air passing through the supply pipe, thereby increasing the flow rate of the air supplied to the space formed at the bottom side of the substrate.

8. The liquid processing apparatus of claim 7, further comprising a control unit configured to control the air supply unit,
   wherein the control unit controls the air supply unit in such a manner that the flow rate of the air supplied from the air supply unit is increased as the number of revolutions of the substrate held by the substrate holding unit is increased.

9. The liquid processing apparatus of claim 1, further comprising:
   a filter member configured to clean the air supplied from the air supply unit; and
   a baffle member provided to be spaced apart from the filter member and configured to distribute the air cleaned by the filter member evenly toward the substrate held by the substrate holding unit,
   wherein the suction port of the air supply path is disposed in a space formed between the filter member and the baffle member.

10. The liquid processing apparatus of claim 9, wherein the rotation driving unit further includes a cylindrical rotating shaft, and the air supply path includes a supply pipe that passes through an inner side of the rotating shaft.

11. The liquid processing apparatus of claim 10, wherein both of the air supply path and the suction port of the air supply path are disposed around the outside of the recovery cup when viewed from the top.

12. The liquid processing apparatus of claim 11, wherein the air supply path further includes a supply port that supplies the air inhaled from the suction port to the space formed at the bottom side of the substrate, and the cross-section of the flow path of the suction port of the air supply path is the same as or larger than that of the supply port.

13. The liquid processing apparatus of claim 12, wherein the supply pipe of the air supply path is connected to the rotating shaft of the rotation driving unit, and a generating mechanism is provided on the inner surface of the supply pipe for generating a swirl for the air passing through the supply pipe, thereby increasing the flow rate of the air supplied to the space formed at the bottom side of the substrate.

14. The liquid processing apparatus of claim 10, wherein a bottom side processing liquid supply pipe that supplies processing liquid to the bottom surface of the substrate held by the substrate holding unit is provided inside the supply pipe.

15. The liquid processing apparatus of claim 14, wherein the supply pipe of the air supply path is connected to the rotating shaft of the rotation driving unit, and a generating mechanism is provided on the inner surface of the supply pipe for generating a swirl for the air passing through the supply pipe, thereby increasing the flow rate of the air supplied to the space formed at the bottom side of the substrate.

16. The liquid processing apparatus of claim 15, wherein the air supply path further includes a supply port that supplies the air inhaled from the suction port to the space formed at the bottom side of the substrate, and the cross-section of the flow path of the suction port of the air supply path is the same as or larger than that of the supply port.

17. The liquid processing apparatus of claim 9, further comprising a control unit configured to control the air supply unit, wherein the control unit controls the air supply unit in such a manner that the flow rate of the air supplied from the air supply unit is increased as the number of revolutions of the substrate held by the substrate holding unit is increased.

18. The liquid processing apparatus of claim 1, wherein the chamber side supply pipe is formed to protrude to an outside of the liquid processing chamber through an inside of the liquid processing chamber starting from the suction port.

* * * * *